United States Patent [19]

Charvin et al.

[11] Patent Number: 5,764,703
[45] Date of Patent: Jun. 9, 1998

[54] CIRCUIT FOR RESTORING BITS TRANSMITTED ASYNCHRONOUSLY

[75] Inventors: Jean-Pierre Charvin, Eybens; Christof Stumpf, Meylan, both of France

[73] Assignee: SGS-Thomson Microelectronics S.A., Saint Genis, France

[21] Appl. No.: 571,614

[22] Filed: Dec. 13, 1995

[30] Foreign Application Priority Data

Dec. 16, 1994 [FR] France .................... 94 15522

[51] Int. Cl.$^6$ .................... H04L 25/06; H04L 25/10
[52] U.S. Cl. .................. 375/317; 375/319; 375/360; 375/370; 375/371; 327/72; 327/87
[58] Field of Search .................... 375/317, 319, 375/355, 360, 369, 370, 371; 327/50, 72, 74, 77, 73, 87

[56] References Cited

U.S. PATENT DOCUMENTS

| 4,418,406 | 11/1983 | Ogawa | 369/124 |
| 4,963,872 | 10/1990 | Schneider et al. | 341/142 |
| 5,136,382 | 8/1992 | Meyer | 348/465 |
| 5,223,930 | 6/1993 | Zato | |
| 5,566,215 | 10/1996 | Coquerel | 375/371 |

FOREIGN PATENT DOCUMENTS

A-0 531 549  3/1993  European Pat. Off. ......... H04N 7/08

*Primary Examiner*—Don N. Vo
*Attorney, Agent, or Firm*—Wolf, Greenfield & Sacks, P.C.; James H. Morris

[57] ABSTRACT

The present invention relates to a circuit for restoring bits transmitted by an asynchronous signal, including a comparator of the signal level with a reference level; a sampling circuit supplying several samples of the comparator output for each time interval corresponding to a bit; a circuit for determining a succession of windows, each of which corresponds to a bit; an acquisition circuit receiving the samples and supplying, for each window, the number of samples having a first logic value, the number of sample transitions, and the value of a border sample of an adjacent window; and an estimation circuit for correcting the reference level and the alignment of the windows on the bits according to the outputs of the acquisition circuit.

26 Claims, 2 Drawing Sheets

5,764,703

CIRCUIT FOR RESTORING BITS TRANSMITTED ASYNCHRONOUSLY

BACKGROUND OF THE INVENTION

1. Field of the Invention

The present invention relates to a circuit for restoring the logic levels of bits transmitted asynchronously and serially in a signal. The present invention relates more particularly to a circuit that properly restores bits even when a transmission signal undergoes phase or amplitude variations.

2. Discussion of the Related Art

FIG. 1 shows an example of a transmission signal 9. The transmission signal 9 is used to transmit teletext information. Each line of teletext information 11 begins with a burst of synchronization pulses 10.

Depending on the conditions at a receiving circuit, a teletext signal may include noise, and be of variable phase and amplitude. However, using the synchronization pulses 10 at the beginning of each line of teletext information 11, the circuit receiving the transmission signal 9 can periodically readjust its receive frequency and a discrimination threshold used to distinguish the high logic levels from the low logic levels in the lines of teletext information 11.

U.S. Pat. No. 5,136,382 describes a circuit for receiving lines of teletext information included in a transmission signal. The frequency and the discrimination threshold found at the beginning of each line are maintained for the entire duration of the line, until the next synchronization pulse burst. Thus, the circuit does not compensate for possible phase and amplitude fluctuations in a line of the teletext information, which could result in many errors if the conditions at the receiving circuit are not optimal. The teletext information may originate from a videotape causing transmission speed changes due to variations in the band unwinding speed.

SUMMARY OF THE INVENTION

An object of the present invention is to provide a circuit enabling a continuous compensation of amplitude and phase fluctuations of an asynchronous bit transmission signal, when the initial transmission frequency and the discrimination threshold are either fixed or periodically determined by means of synchronization pulse bursts.

To achieve this object, the present invention provides a circuit for restoring bits transmitted by an asynchronous signal, in which the signal level of the asynchronous signal is compared with a reference level (Vref). The result of this comparison is sampled a predetermined number of times during a window, i.e., a time interval corresponding to a bit. Moreover, in each window corresponding to a bit, the number of samples at a first logic value and the number of transitions between logic values are counted. The reference level and/or the window beginnings are corrected according to the number of samples at the first logic value, the number of transitions and a logic border value associated to an adjacent window.

According to an embodiment of the present invention, when the number of transitions in a current window is 1, and a majority of samples corresponds to the logic border value, the beginning of the next window is advanced. Otherwise the beginning of the next window is delayed.

According to an embodiment of the present invention, when the number of transitions in a current window is 2, and the number of samples at a high level is lower than a predetermined number by a predetermined amount and the border value is at a low level, the reference level is decreased. Alternatively, when the number of transmissions in the current window is 2, the number of samples at a low level is lower than the predetermined number by a predetermined amount and the border value is at a high level, the reference level is increased.

According to an embodiment of the present invention, a correction that includes advancing or delaying the beginning of the next window, or of decreasing or increasing the reference level (Vref), is performed only if the condition indicating that the correction is necessary occurs repeatedly.

According to an embodiment of the present invention, the bit corresponding to a window is set at a predetermined value if the number of transitions is 2, the number of samples at this predetermined value is greater than or equal to 1, and the border value is equal to the complement of the predetermined value. Otherwise, the bit value is set to the majority value of the window samples.

The foregoing and other objects, features and advantages of the present invention will be more readily understood and apparent from the following detailed description of illustrative embodiments according to the invention, which should be read in conjunction with the accompanying drawings, but not limited by them:

DETAILED DESCRIPTION

Figure 2:
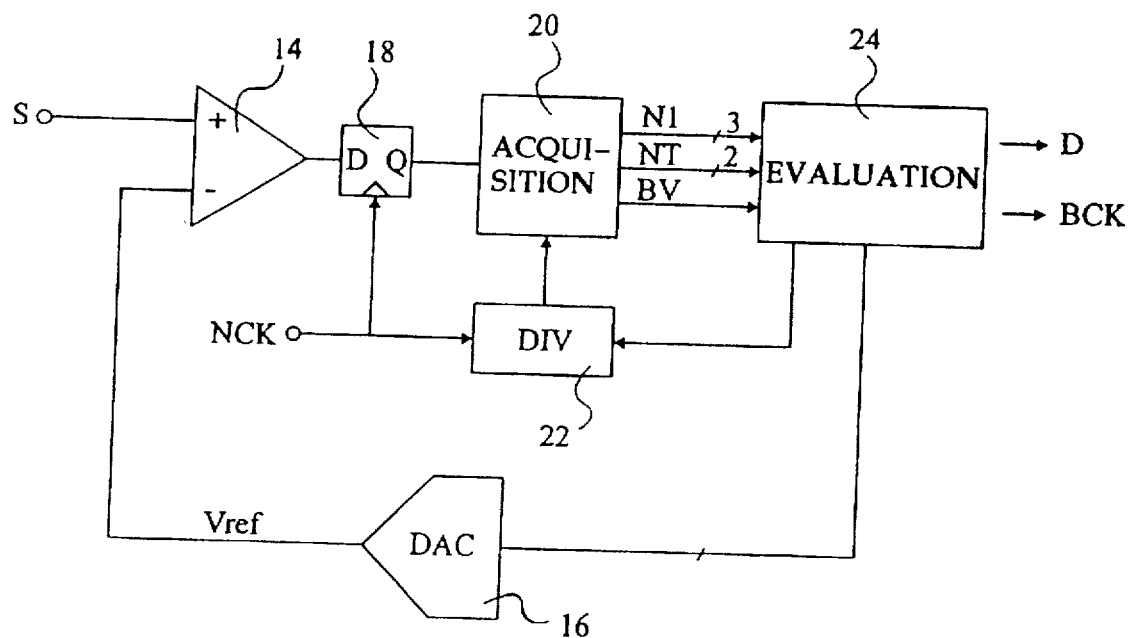
FIG. 2 schematically shows an embodiment of a circuit for restoring bits according to the present invention.

In FIG. 2, an asynchronous bit transmission signal S is received at a non-inverter input of a comparator 14. An inverter input of the comparator 14 receives a reference voltage Vref supplied by a digital-to-analog converter 16. Converter 16 supplies an adjustable discrimination threshold corresponding to the voltage Vref.

The output of comparator 14 is sampled by a flip-flop 18 at a sampling frequency NCK with a period which is N times lower than the nominal duration of a bit transmission. N is preferably an odd number, e.g., 7.

An acquisition circuit 20 receives samples from the flip-flop 18 and examines them in successive windows having widths corresponding to the duration of a bit transmission. The window boundaries are determined by synchronization pulses supplied by a divider 22. The divider 22 receives the sampling frequency NCK and, in normal conditions, divides this frequency by N, e.g., 7.

In each window, the acquisition circuit 20 counts the number N1 of samples in the "1" state and the number NT of sample transitions between logic states. The transitions counted in each window are, for example, those occurring between the beginning of the first sample and the beginning of the last sample of the window. An evaluation circuit 24 receives numbers NT and N1 from the acquisition circuit 20.

According to an embodiment, acquisition circuit 20 additionally provides evaluation circuit 24 with a logic border value BV that, according to various possible alternatives, is the last sample value LSV of the previous window, the last bit value LbV, the value of the first sample of the next window (next sample value NSV), or the estimated next bit value NbV. Evaluation circuit 24 uses values N1, NT and BV to determine the value D of the bit corresponding to the current window, a phase correction value which can be used for modification of the division rate of divider 22, and a correction value of the discrimination threshold Vref which can be used to supply a new value to converter 16. Evaluation circuit 24 supplies, if necessary, a synchronization signal BCK for the bits supplied on output D.

The last bit value LbV corresponds to the current output D of the evaluation circuit 24, before the value of bit D corresponding to the current window is updated. The estimated next bit value NbV corresponds to the second or third sample of the next window. This value NbV is obtained, for example, at the output of comparator 14. Indeed, when the evaluation circuit 24 updates bit D, the output of comparator 14 is in advance of two or three samples because of the presence of several flip-flops (for example flip-flop 18) in the path to the evaluation circuit 24. Finally, the next sample value NSV is taken at the output of the last flip-flop, for example 18, placed in the path to the evaluation circuit 24.

The operation of an embodiment of the present invention will now be described by way of example where each bit is sampled seven times and where no more than two transitions of the sample in a window are taken into account. In this example, number N1 is supplied to the evaluation circuit 24 through a three bit bus and number NT through a two bit bus.

Figure 3:
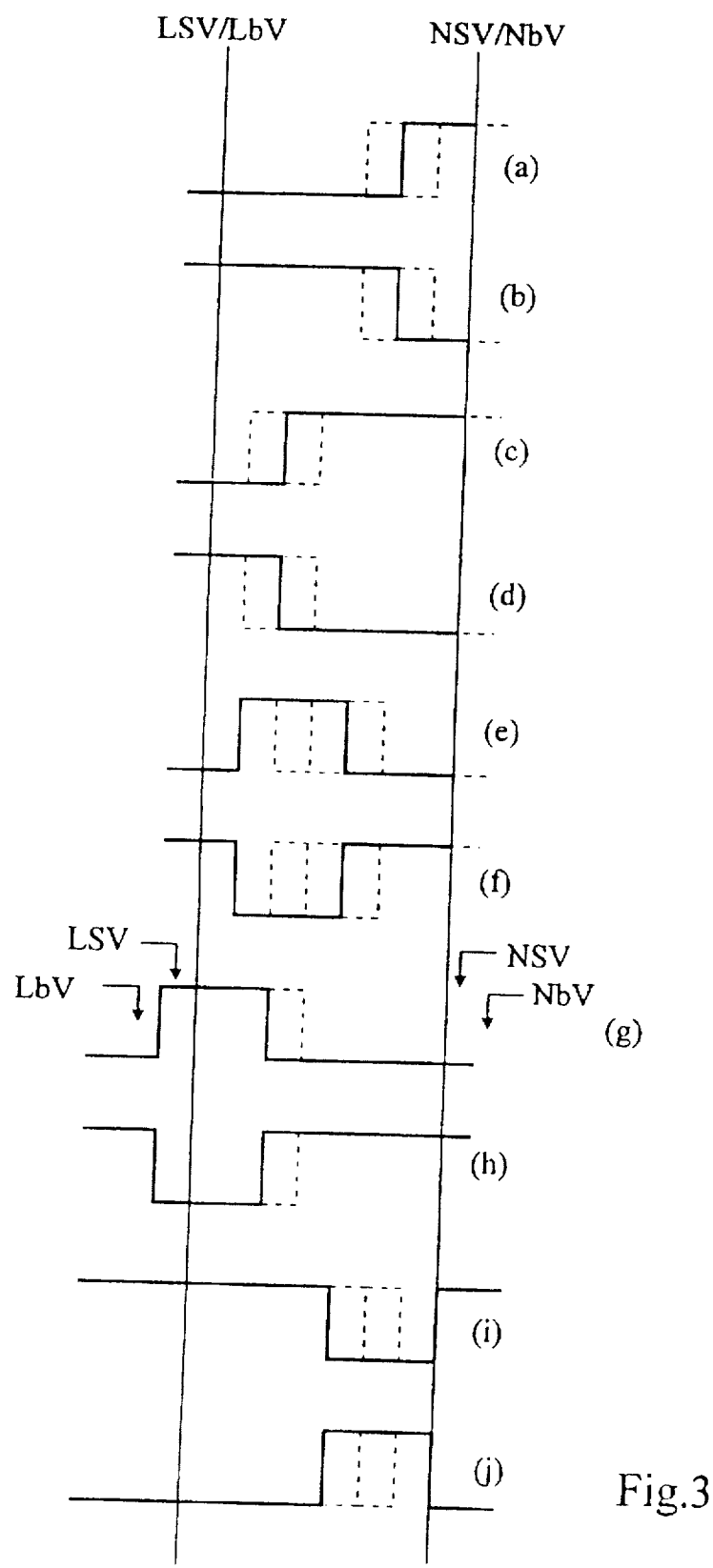
FIG. 3 shows various cases of analysis, according to the present invention, of a transmission signal.

FIG. 3 aims at illustrating, as an example, how the evaluation circuit 24 interprets, according to the invention, various families, numbered from (a) to (f), of sample cases inside a window. The window is delimited by two vertical lines. A sample transition coinciding with the beginning of a window is counted in this window and the considered border value BV is, for example, the last sample value LSV. Each of the other border values LbV, NSV and NbV could be used instead of value LSV.

Family (a) corresponds to cases where there is a single transition, the last sample value LSV of the previous window is 0, and no more than three samples of the current window are 1. As illustrated in FIG. 3, the transition is an upward transition and occurs at the beginning of either the fifth, sixth or seventh sample.

Family (b) corresponds to complementary cases of family (a). In particular, there is a single transition, where the last sample value LSV of the previous window is 1, and no more than three samples of the current window are 0. As illustrated, the transition is a downward transition and occurs at the beginning of either the fifth, sixth or seventh sample.

Families (a) and (b) correspond to cases where the windows follow each other with a phase delay compared to the bit transmission. Evaluation circuit 24 detects this situation by means of a simple analysis of values N1, NT and LSV and controls the divider 22 to reduce its division rate. For example, changing the division rate from 7 to 6 shortens the next window and brings its end near the normal end of the next bit.

Family (c) corresponds to cases where there is a single transition, the last sample value LSV is 0, and no more than three samples of the current window are 0. As illustrated, the transition is an upward transition and occurs at the beginning of either the second, third or fourth sample.

Family (d) corresponds to complementary cases of family (c). In particular, there is a single transition, the last sample value LSV is 1, and no more than three samples of the current window are 1. As illustrated, the transition is a downward transition and occurs at the beginning of either the second, third or fourth sample.

Families (c) and (d) correspond to cases where the windows follow each other with a phase advance compared to the bit transmission. Evaluation circuit 24 detects this situation and controls the divider 22 to increase its division rate. For example, changing the division rate from 7 to 8 enlarges the next window and brings the end of the next window near the normal end of the next bit.

Family (e) corresponds to cases where there are two transitions, the number of samples equaling 1 is no more than 4, and the last sample value LSV is 0. The first transition, upward, can coincide with the beginning of the window, and the second transition, downward, can occur, at the latest, at the beginning of the seventh sample, and is no more than four samples away from the first transition.

Figure 1:
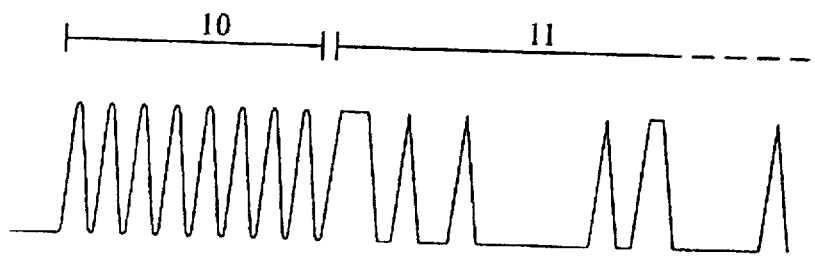
FIG. 1 shows an example of a bit transmission signal, beginning with a synchronization pulse burst.

Family (e) corresponds to cases where discrimination threshold Vref has too high a value. As shown in FIG. 1, the leading edges of the transmission signal generally have a relatively weak slope. Accordingly, when the discrimination threshold is too high, there are more samples at 0 than at 1 for a single bit at 1. Evaluation circuit 24 detects this situation by means of a simple analysis of values N1, NT, and LSV, and decreases the discrimination threshold Vref by supplying digital-to-analog converter 16 with a lower value.

Family (f) corresponds to complementary cases of family (e). In particular, there are two transitions, there are no more than 4 samples at 0, and the last sample of the former window is at 1. The first transition, downward, can coincide with the beginning of the window, and the second transition, upward can occur, at the latest, at the beginning of the seventh sample, and is no more than four samples away from the first.

Family (f) corresponds to cases where the discrimination threshold has too low a value. Evaluation circuit 24 detects this situation by analyzing values N1, NT and LSV, and increases the discrimination threshold Vref by increasing the value supplied to converter 16.

A correction (i.e., a modification of the window width or of the discrimination threshold) may be performed only if the conditions indicating that the correction is necessary occur repeatedly. For example, in one embodiment, the window width is decreased in situation (a) only if this situation occurs repeatedly a predetermined number of times. In this embodiment, a number representative of the error to be corrected is added at each window. When the added value exceeds a predetermined threshold, the correction is performed and the addition is reinitialized. Number N1 is representative of the error in situations (a), (d) and (f). The value 7−N1 (7 being the number of times each bit is sampled in this example) is representative of the error in situations (b), (c) and (e). In the cases where the discrimination threshold is modified, this modification can be proportional to the value representative of the error (N1 or 7−N1).

In one embodiment, the D value of each bit corresponding to a window is established, for example, by means of a majority vote, i.e. the majority value of the samples of the corresponding window. This rule does not apply for family (e) where 1 to 3 samples are 1 and family (f) cases where 1 to 3 samples are 0. For family (e) and family (f) cases, it is assumed that the low number of samples at 1 or at 0 indicates that the corresponding bit is at 1 or 0 for the entire time interval of the window, since it is assumed that the low number of samples is caused by too low or too high a discrimination threshold.

In another embodiment, value D is the value of the median sample of the window.

The bit synchronization signal BCK corresponds, for example, to the pulses delivered by the divider 22.

The embodiment that has just been described, which continuously achieves phase and threshold amplitude corrections, applies to any asynchronous bit transmission signal, whose transmission frequency and amplitude have known nominal values.

The applicant noticed, especially in an application to teletext, that better results are obtained when the phase is locally and periodically adjusted and by not correcting the phase during the transmission of the bits to recover. This better compensates for a group delay effect which abruptly and randomly modifies the phase of a transition without affecting the next transition.

Accordingly, in a second embodiment of the circuit according to the invention, the phase is not corrected during the transmissions of the bits to recover. In the example of the processing of a teletext signal (FIG. 1), the phase is adjusted during each synchronization burst 10 by synchronizing the windows (determined by the output of divider 22) with the transitions of the pulses of burst 10. The phase obtained at the end of burst 10 is confirmed during the reception of a start-of-transmission code 11100100 (which appears at the beginning of interval 11 in FIG. 1). This confirmation consists in correcting the phase, in the manner previously described in relation with the families of cases (b) and (d), for the first two transitions of the start code, i.e. between 111 and 00, and between 00 and 1. The obtained phase is maintained up to the next burst 10. Preferably, the last bit value LbV is used instead of the last sample value LSV for the phase corrections.

To determine the value of each bit D, several of the four border values LSV, LbV, NSV and NbV are used according to the different specific cases described hereafter.

In the cases of family (e), bit D is affected with state 1 if:
the number N1 of samples at 1 is comprised between 1 and 3;
the number NT of transitions is equal to 2; and
the last bit value LbV and the last sample value LSV are equal to zero.

In the cases of family (f), bit D is affected with state 0 if:
number N1 is comprised between 5 and 6;
number NT is equal to 2; and
values LbV and LSV are equal to 1.

Families of cases (g) and (h), illustrated in FIG. 3, correspond to short pulses starting just before the beginning of a current window and which must be interpreted as isolated bits.

In the cases of family (g), bit D is affected with state 1 if:
number N1 is comprised between 2 and 3;
number NT is equal to 1;
values LbV and LSV are different; and
value LbV and the next sample value NSV are equal to zero.

In the cases of family (h), complementary to the cases of family (g), bit D is affected with state 0 if:
number N1 is comprised between 4 and 5;
number NT is equal to 1;
values LbV and LSV are different; and
values LbV and NSV are equal to 1.

In the cases, not illustrated, symmetrical to those of families (g) and (h), i.e. for short pulses finishing just after the beginning of the next window, bit D is affected with state 1 if:

number N1 is comprised between 2 and 3;
number NT is equal to 1;
values LbV and LSV are equal;
the estimated next bit value NbV and value NSV are different; and
values LbV and NbV are equal to zero.

And bit D is affected with state 0 if:
number N1 is comprised between 4 and 5;
number NT is equal to 1;
values LbV and LSV are equal;
values NbV and NSV are different; and
values LbV and NbV are equal to 1.

Families of cases (i) and (j) correspond to families (e) and (f) in the limit situations where the second transition arrives at the beginning of the next window, which means that this second transition is not counted in the current window.

In the cases of family (i), bit D is affected with state 1 if:
number N1 is comprised between 1 and 3;
number NT is equal to 1;
values LbV, LSV, NbV and NSV are equal to zero.

In the cases of family (j), bit D is affected with state zero if:

number N1 is comprised between 4 and 6;
number NT is equal to 1; and
values LbV, LSV, NbV and NSV are equal to 1.

In all the other cases, the state of bit D is determined by majority vote.

The corrections of the threshold amplitude are not modified with respect to what has been described in relation with the families of cases (e) and (f), except that the last bit value LbV is preferably used instead of the last sample value LSV.

Moreover, the threshold is preferably readjusted during each synchronization burst 10. For this purpose, for example, the threshold is affected with a low value at the beginning of each burst 10 and the evaluation circuit 24 achieves corrections for bringing the number N1 of samples at 1 of two consecutive windows to the number N of samples of one window (N=7 in the described example). These corrections are, for example, proportional to the difference N1–N. In order to limit the risk of oscillation, the used proportionality coefficient decreases for the successive differences N1–N (for example, the coefficients 16, 8, 4, 2 and 1 are successively used).

The number of transitions counted in a window may be increased. Additionally, the cases and the corrections to perform may be varied.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for restoring bits transmitted by an asynchronous signal, the circuit comprising:
a comparator that receives the asynchronous signal, receives a reference level signal, and provides an output signal;
a sampling circuit that samples the output signal provided by the comparator, and supplies a plurality of samples of the output signal for each of a plurality of time intervals corresponding to a plurality of bits;

a determining circuit that determines a succession of windows, each window corresponding to one of the plurality of bits;

an acquisition circuit that receives the plurality of samples, and supplies, for each window, a first logic value signal indicating a number of samples having a first logic value, a transition signal indicating a number of sample transitions, and a border signal indicating a logic value of a border sample of an adjacent window; and an estimation circuit that corrects at least one of the reference level signal and an alignment of the succession of windows to the plurality of bits according to the first logic value signal, the transition signal and the border signal supplied by the acquisition circuit.

2. A method for restoring bits transmitted asynchronously as a transmission signal, wherein the transmission signal has a transmission signal level, the method comprising the step of:

comparing the transmission signal level to a reference level, and providing a result of the comparison in a result signal;

sampling the result signal a predetermined number of times during each of a plurality of time intervals, each time interval corresponding to one of a plurality of bits, to form a predetermined number of samples;

counting, in each of a plurality of windows corresponding to a bit, a number of samples at a first logic value and a number of transitions of the samples; and correcting the reference level and beginnings of a current window of the plurality of windows, according to the number of samples at the first logic value in the current window, the number of transitions in the current window, and a logic value of a border sample of an adjacent window of the current window, the adjacent window being one of a next window and a previous window.

3. The method of claim 2, wherein the step of correcting includes, when the number of transitions in the current window is 1, the steps of:

advancing a beginning of the next window if a majority of the samples of the current window has a logic value equaling the logic value of the border sample of the adjacent window, the adjacent window being the previous window; and otherwise, delaying the beginning of the next window.

4. The method of claim 2, wherein the step of correcting includes, when the number of transitions in the current window is 1, the steps of:

advancing a beginning of the next window if a minority of the samples of the current window has a logic value equaling the logic value of the border sample of the adjacent window, the adjacent window being the next window; and otherwise, delaying the beginning of the next window.

5. The method of claim 2, wherein the step of correcting includes, when the number of transitions in a current window is 2, the steps of:

decreasing the reference level if the number of samples of the current window at a high level is lower than a predetermined number by a first predetermined amount and the logic value of the border sample of the adjacent window is at a low level; and increasing the reference level if the number of samples at a low level is lower than the predetermined number by a second predetermined amount and the logic value of the border sample of the adjacent window is at a high level.

6. The method of claim 5, wherein the step of correcting includes the step of:

at least one of advancing and delaying the beginning of the next window in response to a predetermined condition, when the predetermined condition occurs repeatedly.

7. The method of claim 5, wherein the step of correcting includes the step of:

at least one of increasing and decreasing the reference level in response to a predetermined condition, when the predetermined condition occurs repeatedly.

8. The method for restoring bits according to claim 2, further comprising the steps of:

establishing a bit corresponding to the current window to be a predetermined logic value if the number of transitions is 2, the number of samples at the predetermined logic value is at least 2, and the border sample of the adjacent window is equal to a complement of the predetermined logic value; and otherwise, establishing the bit to be a logic value of a majority of the corresponding predetermined number of samples.

9. A method for processing a transmission signal, the method comprising the steps of:

deriving a plurality of sets of signal samples from the transmission signal in accordance with a control signal;

determining, for a first set of the plurality of the sets of signal samples, the number of samples having a first logic value, the number of transitions, and a logic value of a signal sample of an adjacent set of the plurality of sets of signal samples; and adjusting, for a second set of the plurality of sets of signal samples, the control signal according to the determined number of samples, the determined number of transitions, and the determined logic value of the first set, the adjacent set of signal samples being one of the second set and a third set.

10. The method of claim 9, wherein the control signal is an analysis signal that defines a time period; and wherein the step of adjusting includes the step of changing a length of the time period defined by the analysis signal to modify the number of signal samples in the second set.

11. The method of claim 10, wherein the step of deriving includes the steps of:

generating a comparison signal from a comparison of the transmission signal with a reference signal; and sampling the comparison signal at regular intervals within the time period defined by the analysis signal.

12. The method of claim 9, wherein the control signal is a reference signal having a reference level, wherein the step of deriving includes deriving the plurality of sets of signal samples from the transmission signal in accordance with the reference signal, and wherein the step of adjusting includes the step of changing, for the second set, the reference level of the reference signal according to the determined number of samples, the determined number of transitions, and the determined logic value of the first set.

13. The method of claim 12, wherein the step of deriving further includes the step of deriving the plurality of sets of signal samples from the transmission signal in accordance with an analysis signal that defines a time period; and wherein the method further comprises the step of changing a length of the time period defined by the analysis signal to modify the number of signal samples in the second set.

14. The method of claim 9, further comprising the step of generating, for each set of signal samples, a data bit according to the set of signal samples.

15. An apparatus for processing a transmission signal, the apparatus comprising:

a sampling circuit that derives a plurality of sets of signal samples from the transmission signal in accordance with a control signal;

a determining circuit that respectively determines, for each set of signal samples, the number of samples having a first logic value, the number of transitions, and a logic value of a signal sample of an adjacent set of the plurality of sets of signal samples; and means for adjusting, for a second set of the plurality of sets of signal samples, the control signal according to the respectively determined number of samples, the respectively determined number of transitions, and the respectively determined logic value of a first set of the plurality of sets of signal samples, the adjacent set being one of the second set and a third set.

16. The apparatus of claim 15, wherein the control signal is an analysis signal that defines a time period; and wherein the means for adjusting includes means for changing a length of the time period defined by the analysis signal to modify the number of signal samples in the second set.

17. The apparatus of claim 16, wherein the sampling circuit includes:

a comparator that receives the transmission signal with a reference signal, and provides a comparison signal; and a storage device that samples the comparison signal at regular intervals within the time period defined by the analysis signal.

18. The apparatus of claim 15, wherein the control signal is a reference signal having a reference level, wherein the sampling circuit derives the plurality of sets of signal samples from the transmission signal in accordance with the reference signal, and wherein the means for adjusting includes means for changing, for the second set, the reference level of the reference signal according to the respectively determined number of samples, the respectively determined number of transitions, and the respectively determined logic value of the first set.

19. The apparatus of claim 18, wherein the sampling circuit derives the plurality of sets of signal samples from the transmission signal in accordance with an analysis signal that defines a time period; and wherein the apparatus further comprises means for changing a length of the time period defined by the analysis signal to modify the number of signal samples in the second set.

20. The apparatus of claim 15, further comprising a generating circuit that generates, for each set of signal samples, a data bit according to the set of signal samples.

21. An apparatus for processing a transmission signal, the apparatus comprising:

a sampling circuit having a first input that receives the transmission signal, a second input that receives a control signal, and an output that provides a plurality of sets of signal samples;

a determining circuit having a first input coupled to the output of the sampling circuit, and an output bus that respectively provides, for each set of signal samples, the number of samples having a first logic value, the number of transitions, and a logic value of a signal sample of an adjacent set of the plurality of sets of signal samples; and an adjusting circuit having an input bus coupled to the output bus of the determining circuit, and an output coupled to the second input of the sampling circuit.

22. The apparatus of claim 21, wherein the control signal is an analysis signal that defines a time period; and wherein the adjusting circuit includes a divider having an output coupled to the second input of the sampling circuit, the output of the divider being the output of the adjusting circuit.

23. The apparatus of claim 22, wherein the sampling circuit includes:

a comparator having a first input as the first input of the sampling circuit, a second input that receives a reference signal, and an output that provides a comparison signal; and a storage device having a first input coupled to the output of the comparator, a second input as the second input of the sampling circuit that receives the analysis signal, and an output that provides the signal samples.

24. The apparatus of claim 21, wherein the control signal is a reference signal having a reference level, wherein the sampling circuit derives the plurality of sets of signal samples from the transmission signal in accordance with the reference signal, and wherein the adjusting circuit includes circuitry that changes, for a second set of the plurality of sets of signal samples, the reference level of the reference signal according to the respectively determined number of samples, the respectively determined number of transitions, and the respectively determined logic value of a first set of the plurality of sets of signal samples, the adjacent set being one of the second set and a third set.

25. The apparatus of claim 24, wherein the sampling circuit further includes a third input that receives an analysis signal defining a time period; and wherein the apparatus further comprises circuitry that changes a length of the time period defined by the analysis signal to modify the number of signal samples in the second set.

26. The apparatus of claim 21, further comprising circuitry that generates, for each set of signal samples, a data bit according to the set of signal samples.

* * * * *